(12) United States Patent
Liu et al.

(10) Patent No.: US 7,868,807 B2
(45) Date of Patent: Jan. 11, 2011

(54) DATA WEIGHTED AVERAGE CIRCUIT AND DYNAMIC ELEMENT MATCHING METHOD

(75) Inventors: Chang-Shun Liu, Tai Pei (TW); Yi-Chang Tu, Tai Nan (TW); Wen-Chi Wang, Yun Lin County (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/187,869

(22) Filed: Aug. 7, 2008

(65) Prior Publication Data

US 2009/0040087 A1 Feb. 12, 2009

(30) Foreign Application Priority Data

Aug. 10, 2007 (TW) .............................. 96129496 A

(51) Int. Cl.
*H03M 1/66* (2006.01)
(52) U.S. Cl. ...................................... 341/144; 341/143
(58) Field of Classification Search ................ 341/143, 341/155, 144, 106, 50
See application file for complete search history.

(56) References Cited

U.S. PATENT DOCUMENTS

| | | | | |
|---|---|---|---|---|
| 4,309,772 A | * | 1/1982 | Kloker et al. ............... | 375/317 |
| 4,558,370 A | * | 12/1985 | Mitchell et al. ............. | 382/237 |
| 4,791,406 A | * | 12/1988 | Mehrgardt et al. .......... | 341/144 |
| 5,691,719 A | * | 11/1997 | Wakimoto .................... | 341/141 |
| 6,065,107 A | * | 5/2000 | Luick ........................... | 712/32 |
| 6,489,908 B2 | * | 12/2002 | Panasik et al. .............. | 341/144 |
| 6,633,250 B2 | * | 10/2003 | Lee et al. .................... | 341/160 |
| 6,853,322 B2 | * | 2/2005 | Dedic .......................... | 341/144 |
| 7,061,272 B2 | * | 6/2006 | Wilkes et al. ................ | 326/46 |
| 7,183,955 B1 | | 2/2007 | Shih | |
| 7,218,133 B2 | * | 5/2007 | Lewis et al. ................. | 326/10 |
| 7,385,416 B1 | * | 6/2008 | Chirania et al. ............. | 326/38 |
| 7,561,088 B1 | * | 7/2009 | Ferguson ..................... | 341/144 |
| 7,760,121 B2 | * | 7/2010 | Lakdawala et al. .......... | 341/153 |
| 2002/0008649 A1 | * | 1/2002 | Nagata ........................ | 341/126 |

OTHER PUBLICATIONS

Baird, "Linearity Enhancement of the ΔΣ A/D and D/A Converters Using Data Weighted Averaging," IEEE Transactions on Circuits and Systems, Dec. 1995, pp. 753-762, vol. 42-No. 12.
Nys, "A 19-Bit Low-Power Multibit Sigma-Delta ADC Based on Data Weighted Averaging," IEEE Journal of Solid State Circuits, Jul. 1997, pp. 933-942, vol. 32-No. 7.
Galton, "Spectral Shaping of the Circuit Errors in the Digital-to-Analog Converters," IEEE Transactions on Circuits and Systems, Oct. 1997, pp. 808-817, vol. 44-No. 10.

* cited by examiner

*Primary Examiner*—Peguy JeanPierre
(74) *Attorney, Agent, or Firm*—Muncy, Geissler, Olds & Lowe, PLLC

(57) ABSTRACT

A data weighted average circuit is disclosed which includes a lookup unit and a storage unit. The invention uses a lookup table to speed up the circuit operation. Besides, the operation delay is not affected by various orders of the data weighted average circuit and various bit-widths of input data.

38 Claims, 3 Drawing Sheets

| pointer / Din<6:0> | 0000001 | 0000010 | 0000100 | 0001000 | 0010000 | 0100000 | 1000000 |
|---|---|---|---|---|---|---|---|
| 0000000 | 0000000 | 0000000 | 0000000 | 0000000 | 0000000 | 0000000 | 0000000 |
| 0000001 | 0000001 | 0000010 | 0000100 | 0001000 | 0010000 | 0100000 | 1000000 |
| 0000011 | 0000011 | 0000110 | 0001100 | 0011000 | 0110000 | 1100000 | 1000001 |
| 0000111 | 0000111 | 0001110 | 0011100 | 0111000 | 1110000 | 1100001 | 1000011 |
| 0001111 | 0001111 | 0011110 | 0111100 | 1111000 | 1110001 | 1100011 | 1000111 |
| 0011111 | 0011111 | 0111110 | 1111100 | 1111001 | 1110011 | 1100111 | 1001111 |
| 0111111 | 0111111 | 1111110 | 1111101 | 1111011 | 1110111 | 1101111 | 1011111 |
| 1111111 | 1111111 | 1111111 | 1111111 | 1111111 | 1111111 | 1111111 | 1111111 |

FIG. 3 ature of the invention will become apparent from the detailed descrip-

DATA WEIGHTED AVERAGE CIRCUIT AND DYNAMIC ELEMENT MATCHING METHOD

This application claims the benefit of the filing date of Taiwan Application Ser. No. 096129496, filed on Aug. 10, 2008, the content of which is incorporated herein by reference.

BACKGROUND OF THE INVENTION

1. Field of the Invention

The invention relates to a data weighted average circuit, which is applied to a data conversion system such as a sigma-delta modulator (SDM) or a digital-to-analog converter (DAC).

2. Description of the Related Art

In general, there are three common approaches to increasing the resolution of SDMs, i.e., reducing the quantization noise within the signal bandwidth. The first approach is to increase the over-sampling ratio (OSR). The second approach is to increase the number of orders of SDMs. The third approach is to increase the resolution of quantizers, i.e., increasing the number of bits. The third approach directly reduces the overall quantization noise to achieve a higher resolution. A multibit quantizer needs to include a corresponding number of bits only to be linear, whereas the linearity of a multibit DAC has to be greater than the integral linearity of the SDM. For example, a 3-order 2-bit SDM with a 14-bit signal-to-noise ratio (SNR) includes a 2-bit DAC with linearity of at least a 14-bit level.

For example, a 3-bit (8-level) DAC includes 7 digital-to-analog converting (D/A converting) cells, each of which includes one capacitor $C_S$. The mismatch between the capacitors $C_S$ has to be low enough for achieving a high linearity. However, in practical, it is not realizable since the capacitors $C_S$ need to have large capacitance. Thus, previous paper has proposed a method of dynamic selecting capacitors of the DAC cells, which moves the distortion caused by the mismatch out of the signal band. This is called dynamic element matching. Nys et, al, "A 19-Bit Low-Power Multibit Sigma-Delta ADC Based on Data Weighted Averaging," IEEE Journal of Solid-State Circuits, VOL. 32, No. 7, July 1997, discloses a circuit architecture of a Sigma-Delta ADC. And, Baird et, al, "Linearity Enhancement of Multibit ΔΣA/D and D/A Converters Using Data Weighted Averaging," IEEE Transactions on Circuits and Systems II: Analog and Digital Signal Processing, VOL. 42, No. 12, December 1995, discloses a method of linearity enhancement.

SUMMARY OF THE INVENTION

In view of the above-mentioned problems, an object of the invention is to provide a data weighted average circuit, using a lookup table to speed up circuit operation with operation delays not affected by various orders of the data weighted average circuit and various bit-widths of input data.

To achieve the above-mentioned object, the data weighted average circuit of the invention comprises: a lookup unit comprising a lookup table for receiving both a input signal and a second output code and generating a first output code according to the lookup table; and, a storage unit for receiving the first output code and updating the second output code according to a control signal.

Another object of the invention is to provide a dynamic element matching method for selecting a plurality of D/A converting cells according to an input signal, the method comprising: retrieving a first output code from a predetermined lookup table according to the input signal and a second output code; and, updating the second output code according to a control signal and the first output code, wherein the second output code is used to select the plurality of D/A converting cells.

A feature of the invention is that the lookup table is employed to retrieve the output of the data weighted average circuit, thereby suitable for various orders and various bit widths of the data weighted average circuit. If the order of the data weighted average circuit does not correspond to the bit width of the input data, with the same hardware configuration and circuit complexity, only the contents of the lookup table embedded in either the lookup unit or the lookup logic circuit need to be modified, thus capable of speeding up circuit operation and reducing operation delay.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is an example showing a content of a lookup table embedded in the lookup logic circuit of FIG. 2.

DETAILED DESCRIPTION OF THE INVENTION

The data weighted, average circuit and the dynamic element matching method of the invention will be described with reference to the accompanying drawings.

According to the invention, all possible outputs of a data weighted average circuit with a specific order and a specific bit width are pre-stored in an embedded lookup table. According to two sets of input data, a lookup unit 110 or a lookup logic circuit 210 retrieves a corresponding output from the lookup table. According to the invention, without data conversion between thermometer codes and binary codes and without operations of adders, the operation speed is significantly increased and the operation delay is not affected by various orders of the data weighted average circuit and various bit-widths of input data.

Hereinafter, each back-end circuit of two embodiments of the invention is described with a 3-bit (N=3) DAC with 7 D/A converting cells. It should be understood, however, that the invention is not limited to these particular numbers described above.

Figure 1:
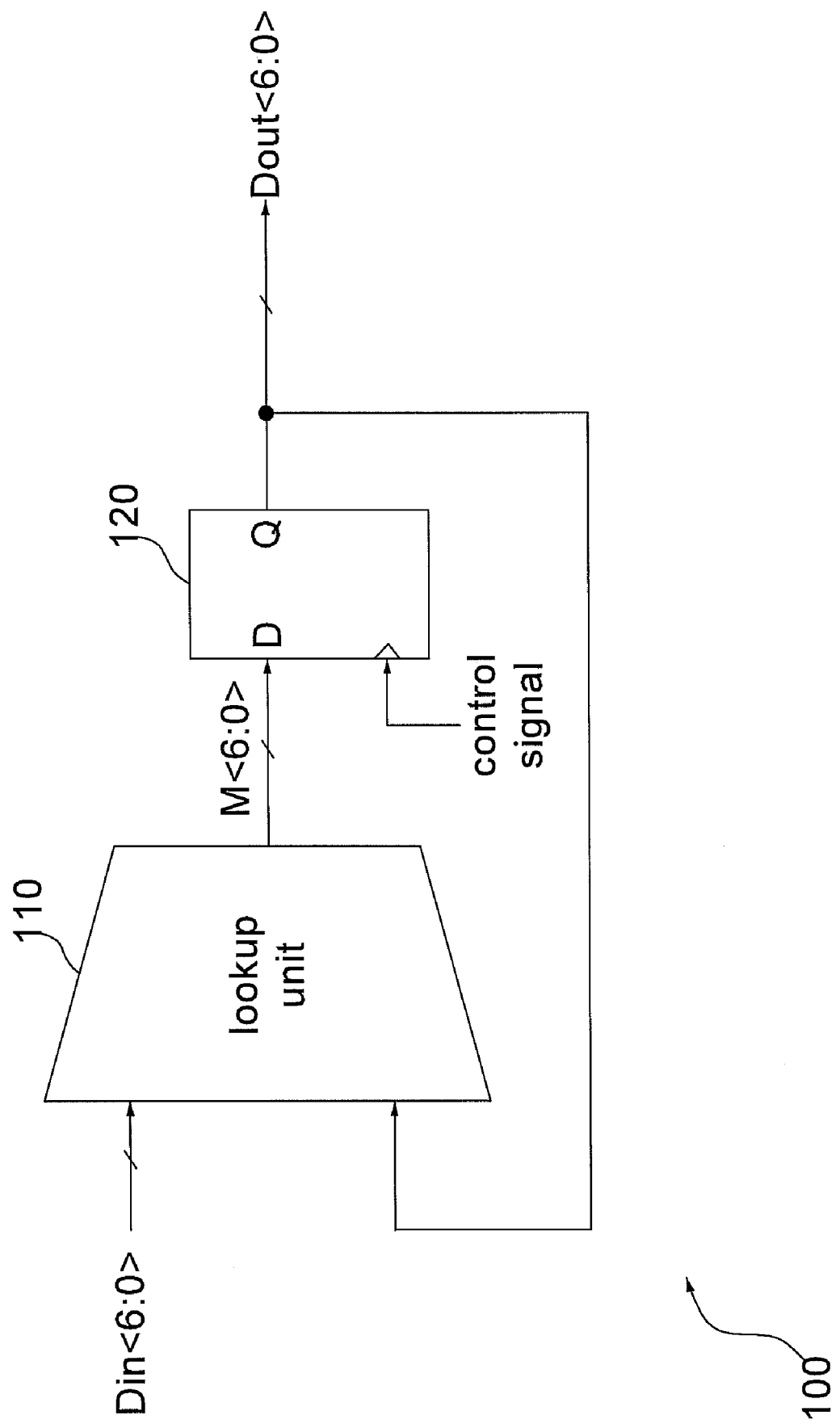
FIG. 1 is a block diagram of a data weighted average circuit according to a first embodiment of the invention.

FIG. 1 is a block diagram of a data weighted average circuit according to a first embodiment of the invention. Referring to FIG. 1, a data weighted average circuit 100 of the invention includes a lookup unit 110 and a set of D flip-flops 120. In this embodiment, the number of D flip-flops in the set of D flip-flops 120 is equal to the number of the bit width of the output M<6:0> of the lookup unit 110. Take, as an example, a back-end circuit of the invention is equipped with 3-bit DAC with 7 D/A converting cells. The number of D flip-flops in the set of D flip-flops 120 is equal to 7. According to this embodiment, the lookup unit 110 with a lookup table is embedded in the data weighted average circuit 100. According to an output Din<6:0> (i.e., a thermometer code) of a quantizer (not shown) and an output Dout<6:0> of the set of D flip-flops 120 during the previous clock cycle, the lookup unit 110 retrieves a corresponding output M<6:0> from the lookup table. Afterward, for all D flip-flops in the set of D flip-flops 120, the Q outputs (Dout<6:0>) simultaneously take on the states of the D inputs (Din<6:0>) according to a control signal (e.g., at the moment of a rising clock edge).

Figure 2:
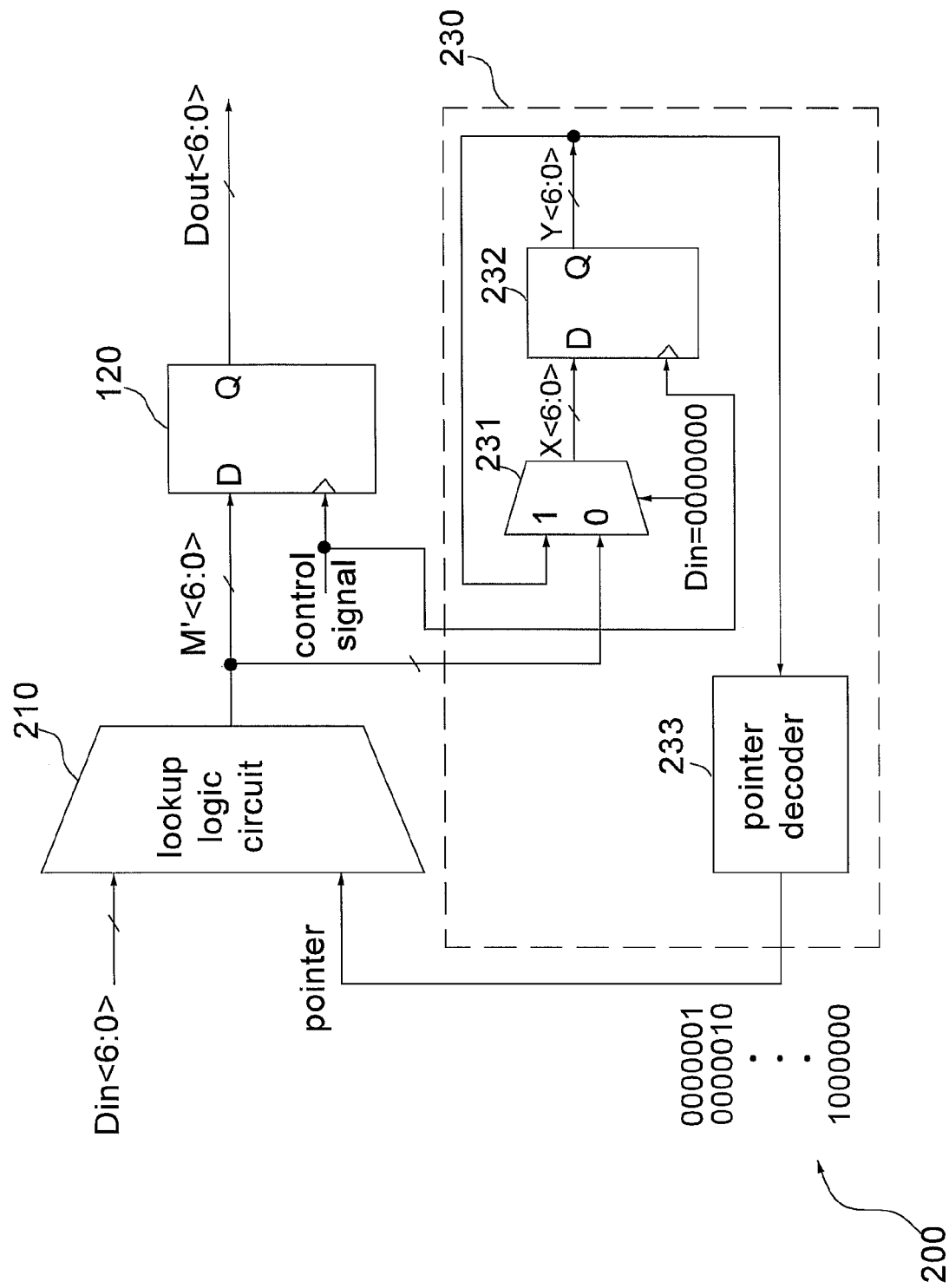
FIG. 2 is a block diagram of a data weighted average circuit according to a second embodiment of the invention.

FIG. 2 is a block diagram of a data weighted average circuit according to a second embodiment of the invention. FIG. 3 is an example showing a content of a lookup table embedded in the lookup logic circuit of FIG. 2. Referring to FIG. 2, a data weighted average circuit 200 of the invention includes a lookup logic circuit 210, a set of D flip-flops 120 and a pointer holding and generating circuit 230. A difference between the first and the second embodiments is that the pointer holding and generating circuit 230 is inserted in the data weighted average circuit 200. In this embodiment, the pointer holding and generating circuit 230 includes a multiplexer 231, a set of D flip-flops 232 and a pointer decoder 233.

Likewise, a lookup table (please refer to FIG. 3) is embedded in the lookup logic circuit 210. According to an output Din<6:0> (i.e., a thermometer code) of a quantizer and a pointer generated by the pointer holding and generating circuit 230, the lookup logic circuit 210 retrieves a corresponding output M'<6:0> from the lookup table. The architecture and operations of the set of D flip-flops 120 are similar to those described in FIG. 1 and therefore the reiteration is omitted. Referring to pointers in the lookup table of FIG. 3, a bit number of a specific bit set to 1 corresponds to the first D/A converting cell number for the next selection. Assuming that a pointer has a value of "0000100" and an input Din<6:0> is equal to "0000111", the lookup logic circuit 210 generates an output M'<6:0> of "0011100". Therefore, the selected D/A converting cell numbers are 3, 4 and 5. A special case is that in which the input Din<6:0> has a value of "0000000" and then no D/A converting cell will be selected. Accordingly, a current pointer value has to be held or saved until the next input arrives. This embodiment implements this function by using the multiplexer 231 and the set of D flip-flops 232. Based on the value of Din<6:0>, the multiplexer 231 selects one value from two values of channel one and channel zero to be an output. If Din<6:0> has a value of "0000000", the value Y<6:0> (the previous output of the lookup logic circuit 210) of channel one is selected for the output X<6:0>. If there is a bit within Din<6:0> not equal to zero, the value M'<6:0> of channel zero is selected for the output X<6:0>. The architecture and operations of the set of D flip-flops 232 are the same as those of the set of D flip-flops 120 and therefore will not be described herein. Please be noted that, in this embodiment, the number of the D flip-flops in the set of D flip-flops 232 are equal to the number of the bit width (i.e., equal to 7) of X<6:0>. Similar to the set of D flip-flops 120, each D flip-flop in the set of D flip-flops 232 has their Q outputs (Y<6:0>) simultaneously take on the state of the D inputs (X<6:0>) according to a common control signal (e.g., at the moment of a rising clock edge). Finally, the pointer 233 decodes the output Y<6:0> of the set of D flip-flops 232 into a pointer. Here, each set of D flip-flops (120, 232) can be replaced by a 7-bit register.

It should be noted that although the lookup unit 110 or the lookup logic circuit 210 can be implemented by using a read-only memory or a combinational logic circuit, the complexity of both circuits (110, 210) are different in practice. Obviously, circuit complexity of the lookup logic circuit 210 with two inputs of Din<6:0> and a pointer is relatively lower. By contrast, circuit complexity of the lookup logic circuit 110 with two inputs of Din<6:0> and Dout<6:0> is relatively higher. Further, the invention is suitable for various orders and various bit widths of the data weighted average circuit. For example, regarding the lookup table of FIG. 3, its values are suitable for 1-order data weighted average circuit and the bit width equal to 7. To implement a data weighted average circuit with a different order and a different bit width, the invention needs to modify the contents of the lookup table only without changing other hardware configuration or complexity. Thus, operation speed is not affected. As the number of orders of the data weighted average circuit gets higher or the bit width gets wider, the operation speed difference between the invention and the prior art becomes bigger.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A data weighted average circuit, comprising:
a lookup unit comprising a lookup table for receiving both an input signal and a second output code and generating a first output code according to the lookup table; and
a storage unit for receiving the first output code and updating the second output code according to a control signal;
wherein the second output code is used to select a plurality of D/A converting cells.

2. The circuit according to claim 1, wherein the storage unit is a set of D flip-flops or a register.

3. The circuit according to claim 1, wherein a capacity of the storage unit corresponds to a bit width of the first output code.

4. The circuit according to claim 1, wherein the lookup unit comprises a read-only memory.

5. The circuit according to claim 1, wherein the lookup unit comprises a combinational logic circuit.

6. The circuit according to claim 1, which is applied to a sigma-delta modulator or a digital-to-analog converter.

7. The circuit according to claim 1, wherein the input signal is a thermometer code.

8. The circuit according to claim 1, wherein a content of the lookup table varies with the number of orders of the data weighted average circuit.

9. The circuit according to claim 1, wherein a content of the lookup table varies with the bit width of the input signal.

10. A data weighted average circuit, comprising:
a lookup unit comprising a lookup table for receiving both an input signal and a second output code and generating a first output code according to the lookup table; and
a storage unit for receiving the first output code and updating the second output code according to a control signal;
wherein a content of the lookup table varies with the number of orders of the data weighted average circuit.

11. A data weighted average circuit, comprising:
a lookup unit comprising a lookup table for receiving both an input signal and a second output code and generating a first output code according to the lookup table; and
a storage unit for receiving the first output code and updating the second output code according to a control signal;

wherein a content of the lookup table varies with the bit width of the input signal.

12. The circuit according to claim 11, wherein the storage unit is a set of D flip-flops or a register.

13. The circuit according to claim 11, wherein a capacity of the storage unit corresponds to a bit width of the first output code.

14. The circuit according to claim 11, wherein the lookup unit comprises a read-only memory.

15. The circuit according to claim 11, wherein the lookup unit comprises a combinational logic circuit.

16. The circuit according to claim 11, which is applied to a sigma-delta modulator or a digital-to-analog converter.

17. The circuit according to claim 10, wherein the storage unit is a set of D flip-flops or a register.

18. The circuit according to claim 10, wherein a capacity of the storage unit corresponds to a bit width of the first output code.

19. The circuit according to claim 10, wherein the lookup unit comprises a read-only memory.

20. The circuit according to claim 10, wherein the lookup unit comprises a combinational logic circuit.

21. The circuit according to claim 10, which is applied to a sigma-delta modulator or a digital-to-analog converter.

22. A data weighted average circuit, comprising:
   a lookup logic circuit comprising a lookup table, for receiving an input signal and a pointer and generating a first output code according to the lookup table;
   a first storage unit for receiving the first output code and updating a second output code according to a control signal; and
   a holding and generating circuit for receiving the first output code and generating the pointer.

23. The circuit according to claim 22, wherein the pointer is held until the next clock cycle arrives if the input signal is equal to a predetermined value.

24. The circuit according to claim 23, wherein the holding and generating circuit comprises:
   a multiplexer for receiving both the first output code and a fourth output code, and selecting the fourth output as a third output code if the input signal is equal to the predetermined value, and selecting the first output as the third output code if not;
   a second storage unit for receiving the third output code to update the fourth output code according to the control signal; and
   a decoder for receiving the fourth output code and generating the pointer.

25. The circuit according to claim 24, wherein the second storage unit is a set of D flip-flops or a register.

26. The circuit according to claim 24, wherein a capacity of the second storage unit corresponds to a bit width of the third output code.

27. The circuit according to claim 23, wherein the predetermined value is equal to zero.

28. The circuit according to claim 22, wherein the first storage unit is a set of D flip-flops or a register.

29. The circuit according to claim 22, wherein the input signal is a thermometer code.

30. The circuit according to claim 22, wherein a capacity of the first storage unit corresponds to a bit width of the first output code.

31. The circuit according to claim 22, wherein the lookup logic circuit comprises a read-only memory or a combinational logic circuit.

32. The circuit according to claim 22, wherein a content of the lookup table varies with the number of orders of the data weighted average circuit.

33. The circuit according to claim 22, wherein a content of the lookup table varies with the bit width of the input signal.

34. A dynamic element matching method for selecting a plurality of D/A converting cells according to an input signal, the method comprising:
   retrieving a first output code from a predetermined lookup table according to the input signal and a second output code; and
   updating the second output code according to a control signal and the first output code, wherein the second output code is used to select the plurality of D/A converting cells.

35. The method according to claim 34, wherein the input signal is a thermometer code.

36. A dynamic element matching method for selecting a plurality of D/A converting cells according to an input signal, the method comprising:
   retrieving a first output code from a predetermined lookup table according to the input signal and a pointer; and
   generating the pointer and a second output code according to a control signal and the first output code, wherein the second output code is used to select the plurality of D/A converting cells and the pointer is held until the next clock cycle arrives if the input signal is equal to a predetermined value.

37. The method according to claim 36, wherein the step of generating the pointer and the second output code comprises:
   selecting a fourth output code to be a third output code if the input signal is equal to the predetermined value, or selecting the first output code to be the third output code if not;
   generating the fourth output code according to the control signal and the third output code; and
   generating the pointer according to the fourth output code.

38. The method according to claim 36, wherein the input signal is a thermometer code.

* * * * *